US011493382B1

(12) United States Patent
Almanza-Workman et al.

(10) Patent No.: US 11,493,382 B1
(45) Date of Patent: Nov. 8, 2022

(54) DEVICES HAVING INVISIBLE SENSOR APERTURES

(71) Applicant: Amazon Technologies, Inc., Seattle, WA (US)

(72) Inventors: Angeles Marcia Almanza-Workman, Sunnyvale, CA (US); Ruomeng Yu, Belmont, CA (US); Ever Edgardo Lopez, San Francisco, CA (US); Seokchan Hong, Palo Alto, CA (US)

(73) Assignee: Amazon Technologies, Inc., Seattle, WA (US)

( * ) Notice: Subject to any disclaimer, the term of this patent is extended or adjusted under 35 U.S.C. 154(b) by 625 days.

(21) Appl. No.: 16/439,250

(22) Filed: Jun. 12, 2019

(51) Int. Cl.
*G01J 1/42* (2006.01)
*G01J 1/04* (2006.01)
*H05K 5/00* (2006.01)
*C03C 17/34* (2006.01)
*G02B 5/08* (2006.01)

(52) U.S. Cl.
CPC ............ *G01J 1/4204* (2013.01); *C03C 17/34* (2013.01); *G01J 1/0407* (2013.01); *G01J 1/0437* (2013.01); *G02B 5/0833* (2013.01); *H05K 5/0017* (2013.01); *C03C 2217/70* (2013.01); *G09G 2360/144* (2013.01)

(58) Field of Classification Search
CPC ...... G01J 1/4204; G01J 1/0437; G01J 1/0407; G01J 1/0488; G01J 1/0418; C03C 17/34; C03C 2217/70; C03C 2217/73; G02B 5/0833; G02B 1/11; G02B 1/115; H05K 5/0017; G09G 2360/144
See application file for complete search history.

(56) References Cited

U.S. PATENT DOCUMENTS

| | | | |
|---|---|---|---|
| 2013/0048837 A1* | 2/2013 | Pope | G01J 1/0407 250/214.1 |
| 2017/0364172 A1* | 12/2017 | Kim | G02B 5/208 |
| 2021/0040328 A1* | 2/2021 | Gianetti | C09D 11/037 |

\* cited by examiner

*Primary Examiner* — Jennifer D Bennett
(74) *Attorney, Agent, or Firm* — Eversheds Sutherland (US) LLP

(57) ABSTRACT

Systems and methods for providing invisible sensor aperture for electronic devices. In one embodiment, an example device may have a display that includes a cover layer, a first layer disposed on the cover layer, the first layer having a substantially white ink that is translucent, a second layer disposed on the first layer, the second layer having the substantially white ink, a third layer disposed on the second layer, the third layer having the substantially white ink, and a fourth layer comprising a dark-colored ink, wherein the fourth layer includes a first aperture aligned with a sensor of the device located beneath the fourth layer.

18 Claims, 7 Drawing Sheets

DEVICES HAVING INVISIBLE SENSOR APERTURES

BACKGROUND

Electronic devices may include displays to present information to users. Some electronic devices may include sensors or other components, such as cameras, proximity sensors, ambient light sensors, and so forth. Electronic devices may come in different colors. For example, smartphones may have faces of colors such as white, black, blue, pink, and so forth. For devices that have light colors, such as white, sensors may be visible to users. For example, sensors and/or corresponding apertures may appear as dark circles on the face of the device. This may negatively affect the aesthetic appearance of the device. Accordingly, devices having invisible sensor apertures may be desired.

Figure 1:
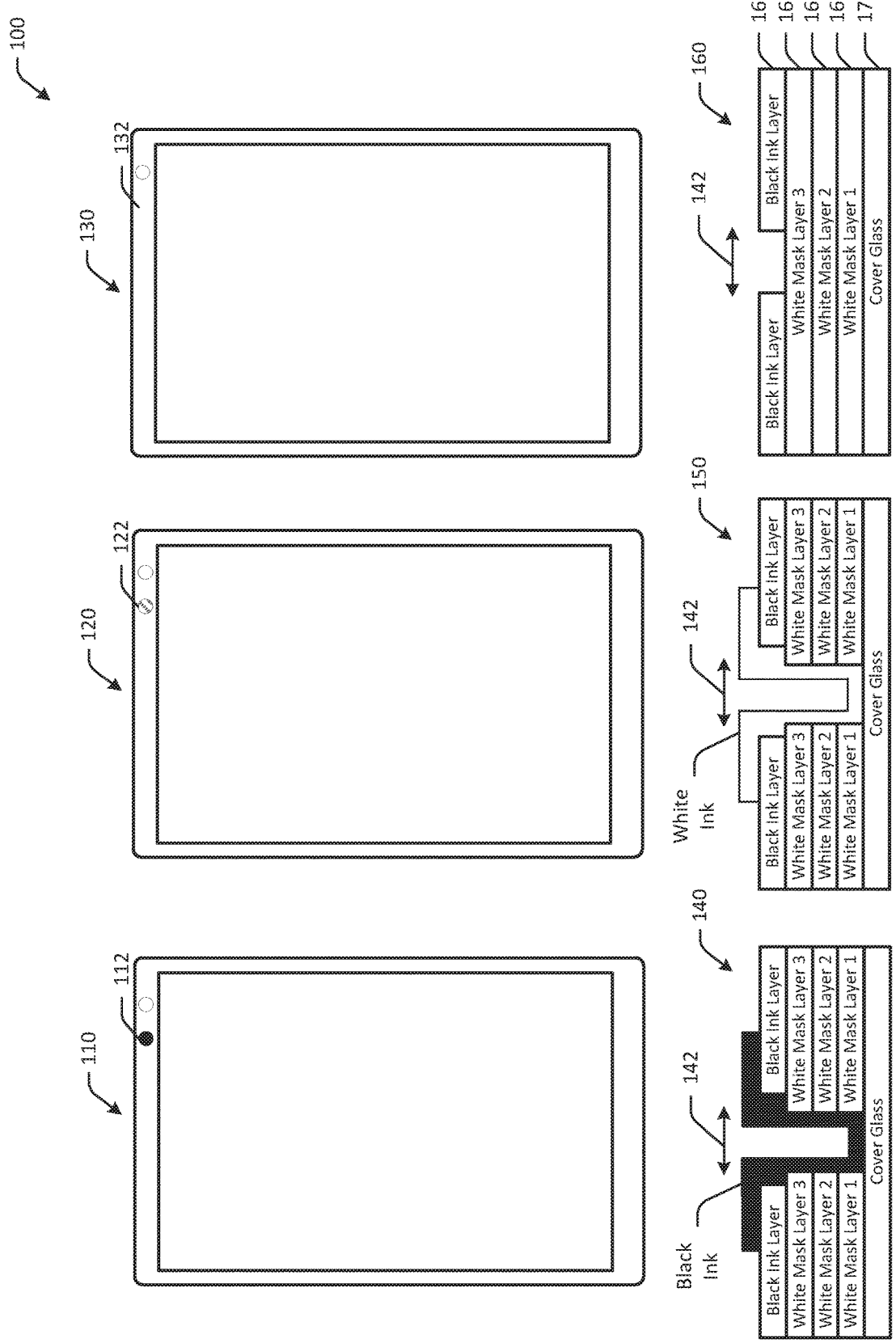
FIG. 1 is a schematic illustration of various electronic devices with front-facing sensors, including an electronic device having invisible sensor apertures in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Multimedia devices may be used to output digital content, and in some instances, to cause content to be presented at one or more display devices for consumption by users. For example, multimedia devices may be content streaming devices that stream digital content, and may be configured to read one or more data storage devices to cause presentation of content stored on the data storage device. Multimedia devices may include a variety of devices, such as electronic reader ("e-reader") devices, desktop computers, portable computers, smartphones, tablet computers, televisions, wearable devices, speaker devices, and so forth that may be used to access various forms of content and other information. Such devices may include displays that are used to present information or content to users.

Certain electronic devices may be light-colored devices or may have light-colored components, such as white colored devices or devices with white faces and/or white housings. Devices with white faces or other light-colored faces may have front-facing components that are painted or otherwise colored with light colors. For example, devices may have white masks that provide a white color appearance. Devices with light-colored housings or faces may be preferred by users for aesthetic reasons and/or due to personal preference.

Such devices, however, may also include one or more sensors. For example, electronic devices may include one or more front-facing sensors, such as proximity sensors, ambient light sensors, fingerprint or other biometric sensors, cameras, and the like. Devices may include sensor apertures aligned with the sensors, where the apertures may be empty or at least partially filled with ink or paint. The sensors and/or corresponding sensor apertures may appear as dark circles or features to users viewing the device, as a result of apertures in the paint or ink used to color the device housing, device, and/or other component. For devices with dark-colored housings or faces, such as black housings, the sensors may blend into the color of the housing and may therefore be imperceptible, or minimally perceptible to users. However, for devices with light-colored housings or faces, the sensors may appear as dark circles or features. This may negatively affect the aesthetic appearance of the device.

Certain solutions, such as using a reduced number of paint or ink layers to cover sensor apertures may impact sensor performance. In addition, other methods of reducing or hiding the appearance of sensor apertures may cause a difference in color between the paint or ink used to cover the sensor aperture and a remainder of the device housing and/or other component. For example, the area around the sensor aperture may appear darker or lighter than the rest of the display housing (e.g., a lighter or darker version of the white or other light-colored paint, etc.).

Embodiments of the disclosure include devices and display stacks having invisible sensor apertures. Display stacks of the disclosure may not only hide sensor apertures, thereby improving aesthetic appearance of light-colored devices, but may also improve sensor performance in some instances. In addition, certain embodiments may be produced with reduced complexity relative to other methods of production, and may be formed at reduced costs. Electronic devices that include display stacks of the disclosure may have invisible sensor apertures, such that users may not perceive sensor locations, or sensor locations may be more difficult to detect visually. Certain devices may have improved appearance as a result of the display stacks and methods described herein.

The techniques, methods, and processes described herein may be used to manufacture plastic and/or glass-based display stack components that can be coupled to other electronic devices. In addition, the material composition of the inks and/or paints of certain embodiments may improve sensor performance, such as sensor field of view and/or optical density. As a result, device and display quality may be improved. While described in the context of display stacks, aspects of this disclosure are more broadly applicable to other forms of displays and/or electronic devices.

Referring to FIG. 1, various electronic devices 100 with front-facing sensors are depicted, including an electronic device 130 having invisible sensor apertures in accordance with one or more embodiments of the disclosure. The examples illustrated in FIG. 1 are for illustrative purposes only, and may be electronic devices with light-colored faces, such as displays with white borders. Borders may surround a display of the electronic device.

In FIG. 1, a first electronic device 110 may be a white-colored device, where a white border surrounds a display of the device. The first electronic device 110 may be, for example, a smartphone. The first electronic device 110 may include one or more sensor apertures 112. The sensor aperture 112 may be for a sensor, such as an ambient light sensor. The sensor aperture 112 may be adjacent to another aperture, such as an aperture for a camera or other component. The sensor aperture 112 may allow for ambient light to propagate to the ambient light sensor for ambient light measurements. As illustrated in FIG. 1, the sensor aperture 112 may be visible to a user as a dark, or black, circle. The sensor aperture 112 may interrupt the otherwise white border of the first electronic device 110.

A second electronic device 120 is also illustrated in FIG. 1. The second electronic device 120 may also be a white-colored device, where a white border surrounds a display of the device. The second electronic device 120 may be, for example, a smartphone. The second electronic device 120 may include one or more sensor apertures 122. The sensor aperture 122 may be for a sensor, such as an ambient light sensor. The sensor aperture 122 may be adjacent to another aperture, such as an aperture for a camera or other component. The sensor aperture 122 may allow for ambient light to propagate to the ambient light sensor for ambient light measurements. As illustrated in FIG. 1, the sensor aperture 122 may be visible to a user as a dark circle. However, the appearance of the sensor aperture 122 may be slightly less in contrast to the remainder of the white border relative to the sensor aperture 112 of the first electronic device 110. The sensor aperture 122 may therefore interrupt the otherwise white border of the second electronic device 120 slightly less than the sensor aperture 112 interrupts the white border of the first electronic device 110.

A third electronic device 130 in accordance with one or more embodiments of the disclosure is also illustrated in FIG. 1. The third electronic device 130 may also be a white-colored device, where a white border surrounds a display of the device. The third electronic device 130 may be, for example, a smartphone. The third electronic device 130 may include one or more sensor apertures 132. The sensor aperture 132 may be for a sensor, such as an ambient light sensor. The sensor aperture 132 may be adjacent to another aperture, such as an aperture for a camera or other component. The sensor aperture 132 may allow for ambient light to propagate to the ambient light sensor for ambient light measurements. As illustrated in FIG. 1, the sensor aperture 132 may be invisible to a user, or may otherwise be difficult to perceive. The appearance of the sensor aperture 132 may not be in contrast to the remainder of the white border, and may appear to be the same color as the remainder of the white border. The sensor aperture 132 may therefore not interrupt the white border of the third electronic device 130.

The first electronic device 110 may include a first display stack 140. The first display stack 140 may include a cover glass or plastic cover layer that forms an outer surface of the first electronic device 110 (e.g., a user may touch the cover glass layer to interact with the first electronic device 110 in some instances, etc.). The first display stack 140 may include multiple layers of white ink. The white ink may provide the white appearance of the border around the display of the first electronic device 110. A first white mask layer, or a first layer of white ink, may be disposed on the cover glass layer. For example, a first layer of white ink or paint may be applied on an inside surface of the cover glass layer (e.g., inside relative to an outside surface of the cover glass layer, where a user may interact with the outside surface, etc.). A second white mask layer, or layer of white ink or paint, may be disposed on the first white mask layer. A third white mask layer may be disposed on the second white mask layer. Any number of white mask layers may be included. A first black mask layer, or a layer of black ink or paint, may be disposed on the third white mask layer. The first black mask layer may be used to mitigate light leakage about the display. For example, the first black mask layer may reduce or prevent light from escaping through the white mask layers and being visible to users, which may result in a glowing or halo effect about the display of the device. The first black mask layer may have a different width than the white mask layers, so as to prevent visibility from outside the first electronic device 110.

The first display stack 140 may include a sensor aperture that extends through each of the white mask layers and the first black mask layer. The sensor aperture may be a hole, opening, or other aperture formed in the ink layers that allows light to pass through the cover glass and propagate to the sensor for detection. The sensor aperture may have a width 142, and may be visible to users. To avoid appearing as a gap in the ink or paint of the white border (and potentially improve sensor performance), an additional black ink layer may be disposed in and around the sensor aperture, as illustrated in FIG. 1. The additional black ink layer may be disposed on both sides of the black mask layer, along the edges of the white mask layers, and on the cover glass layer. The additional black ink layer may cause the dark or black appearance of the sensor aperture 112.

The second electronic device 120 may include a second display stack 150. The second display stack 150 may include a cover glass or plastic cover layer that forms an outer surface of the second electronic device 120 (e.g., a user may touch the cover glass layer to interact with the second electronic device 120 in some instances, etc.). The second display stack 150 may include multiple layers of white ink. The white ink may provide the white appearance of the border around the display of the second electronic device 120. A first white mask layer, or a first layer of white ink, may be disposed on the cover glass layer. For example, a first layer of white ink or paint may be applied on an inside surface of the cover glass layer (e.g., inside relative to an outside surface of the cover glass layer, where a user may interact with the outside surface, etc.). A second white mask layer, or layer of white ink or paint, may be disposed on the first white mask layer. A third white mask layer may be disposed on the second white mask layer. Any number of white mask layers may be included. A first black mask layer, or a layer of black ink or paint, may be disposed on the third white mask layer. The first black mask layer may be used to mitigate light leakage about the display. For example, the first black mask layer may reduce or prevent light from escaping through the white mask layers and being visible to users, which may result in a glowing or halo effect about the display of the device. The first black mask layer may have a different width than the white mask layers, so as to prevent visibility from outside the second electronic device 120.

The second display stack 150 may include a sensor aperture that extends through each of the white mask layers and the first black mask layer. The sensor aperture may be a hole, opening, or other aperture formed in the ink layers that allows light to pass through the cover glass and propagate to the sensor for detection. The sensor aperture may have a width 142, and may be visible to users. To avoid appearing as a gap in the ink or paint of the white border, and to allow for the sensor aperture to blend in with the rest of the white border (and potentially improve sensor performance), an additional white ink layer may be disposed in and around the sensor aperture, as illustrated in FIG. 1. The additional white ink layer may be disposed on both sides of the black mask layer, along the edges of the white mask layers, and on the cover glass layer. The additional white ink layer can be the same or different ink as white mask ink layer. If different ink is used, color matching and opacity may result in a visible difference in color. If the same white mask ink is used, a white ring around the opening may be visible. The additional white ink layer may cause the appearance of the reduced darkness of the sensor aperture 122. However, due to the number of white mask layers along the rest of the white border, and the single additional white ink layer in the sensor aperture 122, the appearance of the sensor aperture 122 may not match the rest of the white border color.

To achieve the invisible sensor aperture of the third electronic device 130, the third electronic device 130 may include a third display stack 160 in accordance with one or more embodiments of the disclosure. For example, the third electronic device 130 may include a housing, an ambient light sensor configured to detect ambient light, the ambient light sensor disposed within the housing, and a display coupled to the housing. The display and/or the device may have the third display stack 160 configuration with a cover glass layer 170 that has a first surface and a second surface. The first surface may form an outer surface of the third electronic device 130. The third display stack 160 may include a cover glass layer 170 or cover plastic layer that forms an outer surface of the third electronic device 130 (e.g., a user may touch the cover glass layer to interact with the third electronic device 130 in some instances, etc.). The third display stack 160 may include one or more layers of white ink. The white ink may provide the white appearance of the border around the display of the third electronic device 130. A first white mask layer 168, or a first layer of white ink, may be disposed on the cover glass layer 170. For example, a first layer of white ink or paint may be applied on an inside surface of the cover glass layer (e.g., inside relative to an outside surface of the cover glass layer, where a user may interact with the outside surface, etc.). A second white mask layer 166, or layer of white ink or paint, may be disposed on the first white mask layer 168. A third white mask layer 164 may be disposed on the second white mask layer 166. Any number of white mask layers may be included. A first black mask layer 162, or a layer of black ink or paint, may be disposed on the third white mask layer 164. The first black mask layer 162 may be used to mitigate light leakage about the display. For example, the first black mask layer 162 may reduce or prevent light from escaping through the white mask layers and being visible to users, which may result in a glowing or halo effect about the display of the device. The layers may have different thicknesses and may not be illustrated to scale, and may not be illustrated to scale with respect to other layers or other figures.

The third display stack 160 may include a sensor aperture that has the same width 142 as the sensor apertures of the first electronic device 110 and the second electronic device 120. However, the sensor aperture 132 of the third display stack 160 may be formed in the black ink layer 162, and not in the white mask layers, as illustrated in FIG. 1. The sensor aperture may be a hole, opening, or other aperture formed in the black ink layer 162. The second aperture 132 may be aligned with a sensor. The white mask layers may extend across the cover glass layer 170 and may cover the sensor aperture formed in the black ink layer 162. In some embodiments, certain components may not be considered to be part of the display stack and may be parts of other components or structures, such as a cover lens or device component.

As a result, the sensor aperture 132 may not be perceptible to users. The color of the sensor aperture 132 may be uniform relative to the rest of the white mask border because the white mask layers cover the sensor aperture. The display stack 160 may therefore have an invisible sensor aperture.

Performance of the sensor in the third electronic device 130 may not be affected due to the white mask layers covering the sensor aperture 132. As described with respect to FIGS. 2-6, the white mask layers may be at least partially formed of a material that includes certain ranges of titanium oxide having certain particle sizes, which may increase a field of view of certain sensors, thereby improving performance.

In some embodiments, the sensor apertures for the respective electronic devices illustrated in FIG. 1 may be apertures for an ambient light sensor, which may be used to set a display brightness based on ambient light conditions in one instance. In the first display stack 140 and the second display stack 150, the black ink layer and the white ink layer, respectively, in the sensor apertures may have collimated transmission values in visible range from 5% to 20%. This attenuating transmission in the visible spectrum creates a ratio between the actual ambient light, and the light that is measured by the ambient sensor. Transmission of less than 5% may degrade sensor performance in low lighting conditions. Transmission of greater than 20% may saturate the sensor, and may degrade sensor performance in high lighting conditions. In addition, infrared light can interfere with the measurement of visible light in instances where ambient light sensors lack infrared rejection functionality. As a result, an infrared transmission of less than about 30% may be needed to avoid inaccuracy under high infrared lighting conditions, such as incandescent lighting conditions, halogen lighting conditions, sunlight lighting conditions, and so forth.

The third display stack 160 may include white mask layers formed of a translucent white ink that has Lambertian scattering transmission properties (e.g., a reflective structure formed by the white ink layers is such that an intensity of light reflected from the reflective structure is proportional to a cosine of an angle between a direction of incident light and the reflective structure, etc.). For example, the white ink, substantially white ink (e.g., equal to or greater than about 80% white color or pigment, etc.) or other light-colored ink, of one or more embodiments of the disclosure may have transmission values in visible wavelength ranges of between about 5% and about 25%, such as about 10% to about 20%, as well as less than 30% in infrared transmission. Such transmission values may be measured with integrated sphere measurement methods. In addition, the material composition of the white ink may create a scattering effect that may improve ambient light sensor field of view, resulting in increased light intensity detection from many angles. In some embodiments, the white ink may be transmissive to ambient light, and the ambient light sensor of the device may be configured to detect ambient light that propagates through the cover glass layer, the first white ink layer, the second white ink layer, and the third white ink layer. In some embodiments, the white ink may be configured to transmit between about 10% and about 20% of light having a visible wavelength, and less than about 30% of light having an infrared wavelength. In some instances, the white ink may have a weight ratio of between about 40% and about 60% titanium oxide. The titanium oxide may have a particle size of between about 0.10 microns to about 0.30 microns, such as between about 0.15 microns and about 0.25 microns, such as a particle size of about 0.15 microns.

Example embodiments of the disclosure provide a number of technical features or technical effects. For example, in accordance with example embodiments of the disclosure, certain embodiments of the disclosure may mitigate light leakage issues, improve sensor performance, and may have transmission values in visible wavelength ranges of about 10% to about 20%, as well as less than 30% in infrared transmission. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
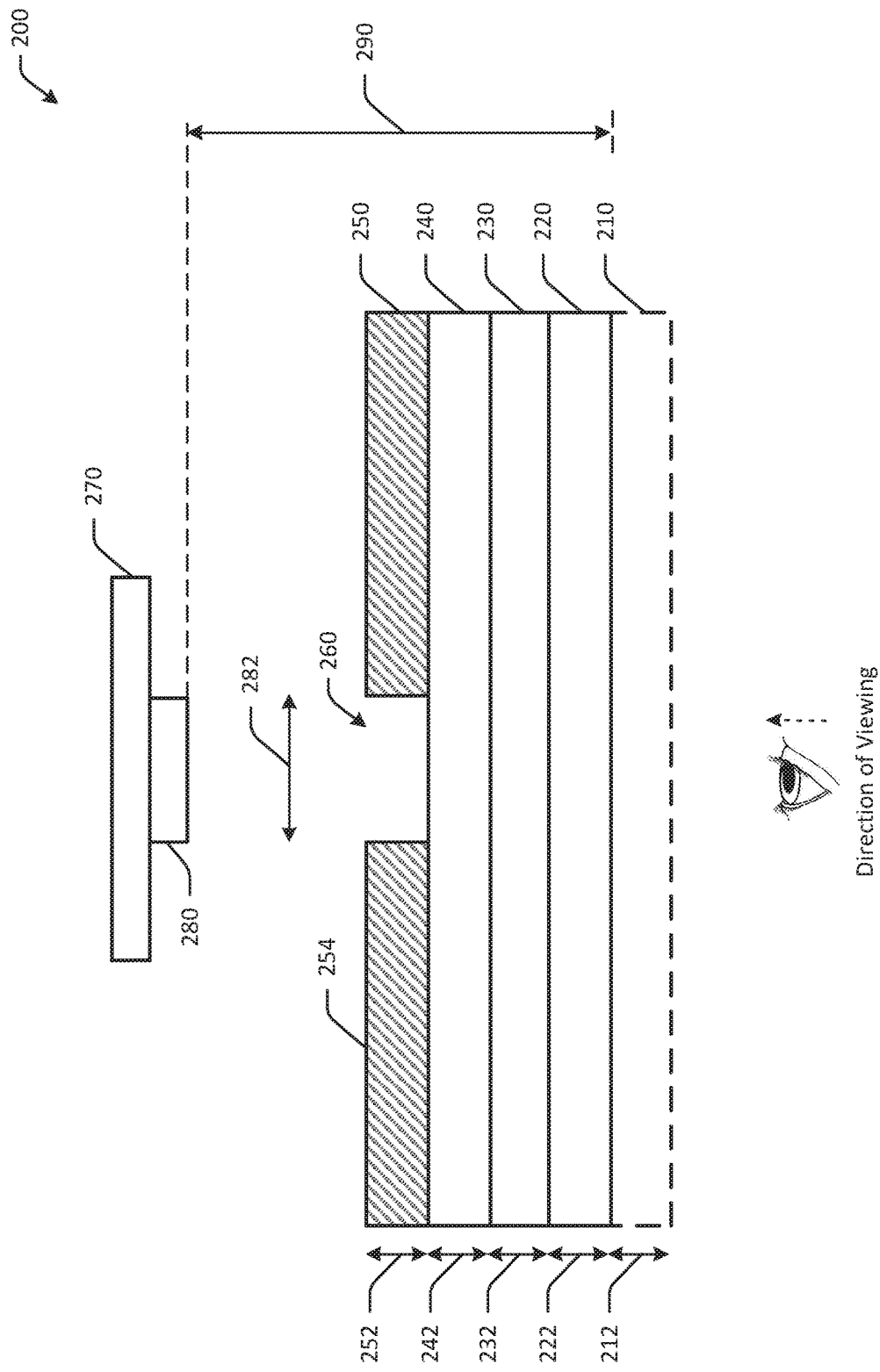
FIG. 2 is a schematic illustration of a cross-sectional view of a display stack and sensor component in accordance with one or more embodiments of the disclosure.

FIG. 2 is a schematic illustration of a cross-sectional view of a display stack 200 and sensor component in accordance with one or more embodiments of the disclosure. Other embodiments may include additional or fewer components. The display stack 200 may be the same display stack as that discussed with respect to FIG. 1.

The display stack 200 may be a display stack for use with an electronic reader device or other device. The device may be an e-reader device, a computer display, a portable computer, a smartphone, a tablet computer, a game console, a television, an in-vehicle display, a voice assistant (display-less) device, and so forth. The display stack 200 may form a portion of a display of the electronic device in some embodiments, or a portion of a housing of the electronic device in other embodiments. In one example, the display stack 200 may form a portion of a touchscreen of the electronic device, where a user may touch or press a portion of the display stack 200 to make a selection or another input.

The device may include a circuit component 270, and one or more sensors, such as an ambient light sensor 280, disposed on the circuit component 270. The circuit component 270 may be a circuit board, flexible circuit component, or other substrate. The ambient light sensor 280 may be configured to detect or measure ambient light levels for environments about the device. The circuit component 270 and the ambient light sensor 280 may be disposed within a housing of the device. The display stack 200 may be separated from the circuit component 270 in some instances.

A portion of the display stack 200 is illustrated in cross-sectional view in FIG. 2. In the illustrated embodiment, the display stack 200 may include a number of layers. The layers may have different thicknesses and may not be illustrated to scale, and may not be illustrated to scale with respect to other layers or other figures.

The display stack 200 may at least partially form a display for a device, and may include a cover layer 210. The cover layer 210 may be a cover glass layer, a cover plastic layer, or formed of a different material. The cover layer 210 may protect the display stack 200 from scratches, scuffs, and other damage. In some embodiments, the cover layer 210 may be a multi-layered structure or composite, and may include one or more anti-glare material layers or coatings. Users that are viewing the display may view the display through the cover layer 210. In addition, light may enter the device through the cover layer 210, and may propagate to the ambient light sensor 280, which may detect ambient light levels. The cover layer 210 may have a first thickness 212 of between about 1 millimeter and about 1.5 millimeters.

The display stack 200 may include a first ink layer 220. The first ink layer 220 may be disposed on the cover layer 210. The first ink layer 220 may include a light-colored ink that is translucent. For example, the first ink layer 220 may include a substantially white ink (e.g., equal to or greater than about 80% white color or pigment, etc.). Translucent ink may be ink through which light can pass. Translucent ink may scatter photons at interfaces between ink layers in some instances. The light-colored ink may be any suitable light color, such as white, yellow, cream, pink, red, and so forth. The light-colored ink may include particles distributed throughout the ink, and therefore distributed throughout the first ink layer 220. For example, the first ink layer 220 may include titanium oxide particles that cause light to scatter during propagation. In some embodiments, the titanium oxide particle size may be between about 0.10 microns and about 0.20 microns, such as about 0.15 microns. The ink formulation and/or first ink layer 220 may have a concentration or weight ratio of the titanium particle size of between about 40% to about 60%. In some embodiments, the light-colored ink may have a weight ratio of between about 40% and about 60% titanium oxide, where the titanium oxide has a particle size of between about 0.15 microns and about 0.25 microns, such as about 0.15 microns. Other embodiments may include other ink pigments with particle sizes, such as pigments, of between about 0.2 microns and about 0.25 microns, but with smaller concentration or weight ratios in the ink formulation of between about 0.1% and about 0.2%. In some embodiments, titanium oxide particle diameter may be slightly less than one-half the wavelength of light scattered. For example, at about 0.2 microns, the sum of the light scattered at all wavelengths may be maximized. The first ink layer 220 may have a second thickness 222 of between about 4 microns and about 7 microns. The light-colored ink may be configured to transmit between about 10% and about 20% of light having a visible wavelength, and less than or equal to about 30% of light having an infrared wavelength.

The display stack 200 may include a second ink layer 230. The second ink layer 230 may be disposed on the first ink layer 220. The second ink layer 230 may include the same light-colored ink of the first ink layer 220. The second ink layer 230 may have a third thickness 232 of between about 4 microns and about 10 microns.

The display stack 200 may include a third ink layer 240. The third ink layer 240 may be disposed on the second ink layer 230. The third ink layer 240 may include the same light-colored ink of the first ink layer 220 and the second ink layer 230. The third ink layer 240 may have a third thickness 242 of between about 4 microns and about 7 microns. Although three light-colored ink layers are illustrated in FIG. 2, other embodiments may include additional or fewer layers. The display stack 200 may therefore include one or more light-colored ink layers, such as a plurality of light-colored ink layers.

The display stack 200 may include a fourth ink layer 250/254. The fourth ink layer 250/254 may be disposed on the third ink layer 240. The fourth ink layer 250/254 may include a dark-colored ink, such as a gray or black colored ink. For example, the fourth ink layer 250 may include a substantially black ink (e.g., equal to or greater than about 80% black color or pigment, etc.). The fourth ink layer 250/254 may mitigate a glowing appearance about an edge of the display, and may potentially reduce light leakage. The fourth ink layer 250/254 may have a fourth thickness 252 of between about 4 microns and about 7 microns. Although one dark-colored ink layer is illustrated in FIG. 2, other embodiments may include additional or fewer layers.

The fourth ink layer 250/254 may include an aperture 260 that is aligned with the sensor 280 of the device. The aperture 260 may allow light to pass through the fourth ink layer 250/254 without alteration. The aperture 260 may have a width 282 of about 1.5 millimeters to about 5 millimeters. In some instances, the width 282 of the aperture may depend on a distance 290 between the ambient light sensor 280 and the cover layer 210. For example, as the distance 290 increases, the width 282 may increase.

As illustrated, the first ink layer 220, the second ink layer 230, and the third ink layer 240 may be devoid of apertures that are aligned with the aperture 260. For example, the first ink layer 220, the second ink layer 230, and the third ink layer 240 may be continuous and may span over or overlay the aperture 260. As a result, light that enters the device may propagate through the first ink layer 220, the second ink layer 230, and the third ink layer 240 before reaching the sensor 280. However, due to the scattering properties of the ink composition of the first ink layer 220, the second ink layer 230, and the third ink layer 240 (e.g. the first ink layer, the second ink layer, and the third ink layer may be configured to scatter ambient light that propagates through the respective layers, etc.), a field of view of the sensor 280 may be enhanced.

The display stack 200 may have a total thickness of between about 35 microns and about 60 microns. As the first thickness 212 of the cover layer 210 increases, the thickness of the light-colored ink layers, or the number of light-colored ink layers, may increase. In some instances, the light-colored ink layers may have a different thickness than the dark-colored ink layer. For example, the first ink layer 220, the second ink layer 230, and the third ink layer 240 may have uniform thickness, whereas the fourth ink layer 250 may have a fourth thickness 252 that is less than the first thickness 222.

The first ink layer 220, the second ink layer 230, and the third ink layer 240 together may form a reflective structure having Lambertian scattering properties. As a result, an intensity of light reflected from the reflective structure may be proportional to a cosine of an angle between a direction of incident light and the reflective structure. Particle size and/or concentration of the titanium oxide particles in the light-colored ink may impact the Lambertian scattering profile. As concentration increases, particle size may decrease to maintain a desired scattering of light. Other factors that may influence performance may include a number of ink layers, an amount of pigment, a thickness of the cover layer, titanium oxide particle size/concentration, index of refraction of resin, and/or other factors.

Because the sensor aperture 260 is "covered" by the three light-colored ink layers, the sensor aperture 260 may not be visible to users viewing the display. However, sensor performance and function may not be negatively impacted.

Figure 3:
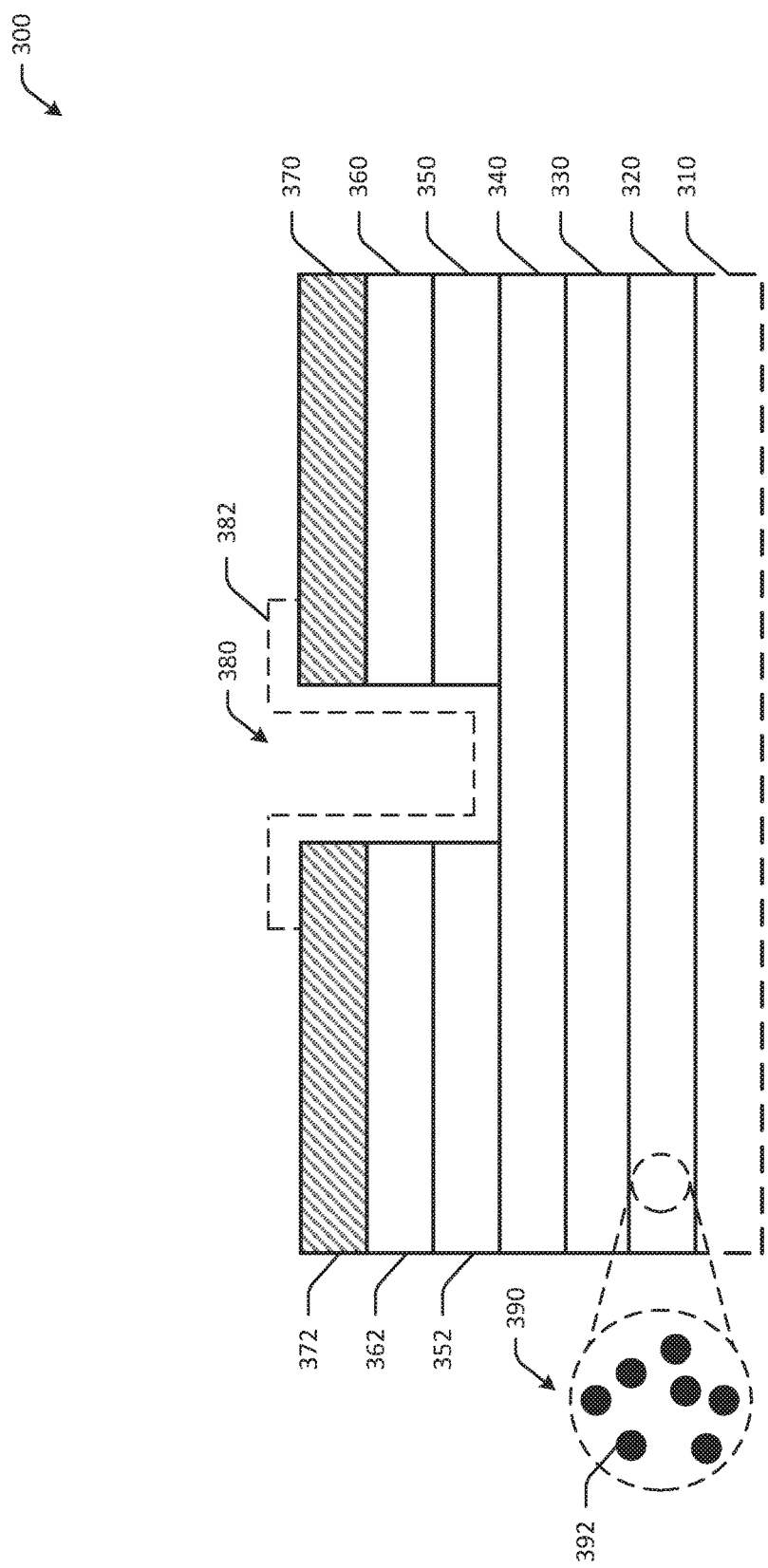
FIG. 3 is a schematic illustration of a cross-sectional view of a display stack in accordance with one or more embodiments of the disclosure.

FIG. 3 is a schematic illustration of a cross-sectional view of a display stack 300 in accordance with one or more embodiments of the disclosure. Other embodiments may include additional or fewer components. The display stack 300 may be the same display stack as that discussed with respect to FIGS. 1-2.

Relative to the display stack 200 of FIG. 2, the display stack 300 may include additional light-colored ink layers. However, the additional light-colored ink layers may include sensor apertures. The additional light-colored ink layers may be included to match transmissivity. Transmissivity is an optical property of a material, which describes how much light is transmitted through material in relation to an amount of light incident on the material. The light that was not transmitted was either reflected or absorbed.

The display stack 300 may be a display stack for use with an electronic reader device or other device. The device may be an e-reader device, a computer display, a portable computer, a smartphone, a tablet computer, a game console, a television, an in-vehicle display, a voice assistant (displayless) device, and so forth. The display stack 300 may form a portion of a display of the electronic device in some embodiments, or a portion of a housing of the electronic device in other embodiments. In one example, the display stack 300 may form a portion of a touchscreen of the electronic device, where a user may touch or press a portion of the display stack 300 to make a selection or another input.

A portion of the display stack 300 is illustrated in cross-sectional view in FIG. 3. In the illustrated embodiment, the display stack 300 may include a number of layers. The layers may have different thicknesses and may not be illustrated to scale, and may not be illustrated to scale with respect to other layers or other figures.

The display stack 300 may at least partially form a display for a device, and may include a cover layer 310. The cover layer 310 may be a cover glass layer, a cover plastic layer, or formed of a different material. The cover layer 310 may protect the display stack 300 from scratches, scuffs, and other damage. In some embodiments, the cover layer 310 may be a multi-layered structure or composite, and may include one or more self-healing material layers or coatings. Users that are viewing the display may view the display through the cover layer 310. In addition, light may enter the device through the cover layer 310, and may propagate to an ambient light sensor, which may detect ambient light levels. The cover layer 310 may have a thickness of between about 50 microns and about 2 millimeters, such as between about 1 millimeter and about 1.8 millimeters.

The display stack 300 may include a first ink layer 320. The first ink layer 320 may be disposed on the cover layer 310. The first ink layer 320 may include a light-colored ink that is translucent. Translucent ink may be ink through which light can pass. Translucent ink may scatter photons at interfaces between ink layers in some instances. The light-colored ink may be any suitable light color, such as white, yellow, cream, pink, red, and so forth. The light-colored ink may include particles distributed throughout the ink, and therefore distributed throughout the first ink layer 320. For example, as illustrated in detail view 390, the first ink layer 320 may be formed of an ink that includes titanium oxide particles 392 that cause light to scatter during propagation.

In some embodiments, the titanium oxide particle size may be between about 0.10 microns and about 0.20 microns, such as about 0.15 microns. The ink formulation and/or first ink layer 320 may have a concentration or weight ratio of the titanium particle size of between about 40% to about 60%. In some embodiments, the light-colored ink may have a weight ratio of between about 40% and about 60% titanium oxide, where the titanium oxide has a particle size of between about 0.15 microns and about 0.25 microns, such as about 0.15 microns. Other embodiments may include other ink pigments with particle sizes of between about 0.2 microns and about 0.25 microns, but with smaller concentration or weight ratios in the ink formulation of between about 0.1% and about 0.2%. In some embodiments, titanium oxide particle diameter may be slightly less than one-half the wavelength of light scattered. For example, at about 0.2 microns, the sum of the light scattered at all wavelengths may be maximized. The first ink layer 320 may have a thickness of between about 4 microns and about 7 microns. The light-colored ink may be configured to transmit between about 10% and about 20% of light having a visible wavelength, and less than or equal to about 30% of light having an infrared wavelength.

The display stack 300 may include a second ink layer 330. The second ink layer 330 may be disposed on the first ink layer 320. The second ink layer 330 may include the same light-colored ink of the first ink layer 320. The second ink layer 330 may have a thickness of between about 4 microns and about 7 microns.

The display stack 300 may include a third ink layer 340. The third ink layer 340 may be disposed on the second ink layer 330. The third ink layer 340 may include the same light-colored ink of the first ink layer 320 and the second ink layer 330. The third ink layer 340 may have a thickness of between about 4 microns and about 7 microns.

The display stack 300 may include a fourth ink layer 350/352. The fourth ink layer 350/352 may be disposed on the third ink layer 340. The fourth ink layer 350/352 may include the same light-colored ink of the first ink layer 320, the second ink layer 330, and the third ink layer 340. The fourth ink layer 350/35 may have a thickness of between about 4 microns and about 7 microns.

The display stack 300 may include a fifth ink layer 360/362. The fifth ink layer 360/362 may be disposed on the fourth ink layer 350/352. The fifth ink layer 360/362 may include the same light-colored ink of the first ink layer 320, the second ink layer 330, the third ink layer 340, and the fourth ink layer 350/352. The fifth ink layer 360/362 may have a thickness of between about 4 microns and about 7 microns.

The display stack 300 may include a sixth ink layer 370/372. The sixth ink layer 370/372 may be disposed on the fifth ink layer 360. The sixth ink layer 370/372 may include a dark-colored ink, such as a gray or black colored ink. The sixth ink layer 370/372 may mitigate a glowing appearance about an edge of the display, and may potentially reduce light leakage. The sixth ink layer 370/372 may have a thickness of between about 4 microns and about 7 microns. Although one dark-colored ink layer is illustrated in FIG. 3, other embodiments may include additional or fewer layers.

An aperture 380 may be formed in the fourth ink layer 350, the fifth ink layer 360/362, and the sixth ink layer 370/372. In contrast to the first ink layer 320, the second ink layer 330, and the third ink layer 340, the fourth ink layer 350 and the fifth ink layer 360/362 may include the aperture 380, although the fourth ink layer 350 and the fifth ink layer 360/362 are light-colored ink layers. The aperture 380 may be aligned with a sensor. The aperture 380 may extend through the fourth ink layer 350 and the fifth ink layer 360/362 so as to avoid excessive light scattering and/or potential blockage of light from reaching a sensor. The aperture 380 may allow light to pass through the fourth ink layer 350, the fifth ink layer 360/362, and the sixth ink layer 380 without alteration. The aperture 380 may have a width of between about 1.5 millimeters to about 4.8 millimeters. In some instances, the width of the aperture may depend on a distance between an ambient light sensor and the cover layer 310. For example, as the distance increases, the width may increase.

As illustrated, the first ink layer 320, the second ink layer 330, and the third ink layer 340 may be devoid of apertures that are aligned with the aperture 380. As a result, light that enters the device may propagate through the first ink layer 320, the second ink layer 330, and the third ink layer 340 before passing through aperture 380 and reaching a sensor. However, due to the scattering properties of the ink composition of the first ink layer 320, the second ink layer 330, and the third ink layer 340 (e.g. the first ink layer, the second ink layer, and the third ink layer may be configured to scatter ambient light that propagates through the respective layers, etc.), a field of view of the sensor may be enhanced. The display stack 300 may have a total thickness of between about 35 microns and about 60 microns.

The first ink layer 320, the second ink layer 330, and the third ink layer 340 together may form a reflective structure having Lambertian scattering properties. As a result, an intensity of light reflected from the reflective structure may be proportional to a cosine of an angle between a direction of incident light and the reflective structure. Particle size and/or concentration of the titanium oxide particles in the light-colored ink may impact the Lambertian scattering profile. As concentration increases, particle size may decrease to maintain a desired scattering of light. Other factors that may influence performance may include a number of ink layers, an amount of pigment, a thickness of the cover layer, titanium oxide particle size/concentration, and/or other factors.

In some embodiments, an optional additional white ink layer 382 may be printed or otherwise disposed after formation of the aperture 380. For example, the additional white ink layer 382 may be formed of the same ink as the first ink layer 320, the second ink layer 330, and/or the third ink layer 340. The additional white ink layer 382 may improve high intensity light detection by an ambient light sensor, particularly in instances where the white ink may have relatively high translucency properties. In some embodiments, more than one additional white ink layer 382 may be disposed in the aperture 380.

Because the sensor aperture 380 is "covered" by the three light-colored ink layers, the sensor aperture 380 may not be visible to users viewing the display. However, sensor performance and function may not be negatively impacted.

Figure 4:
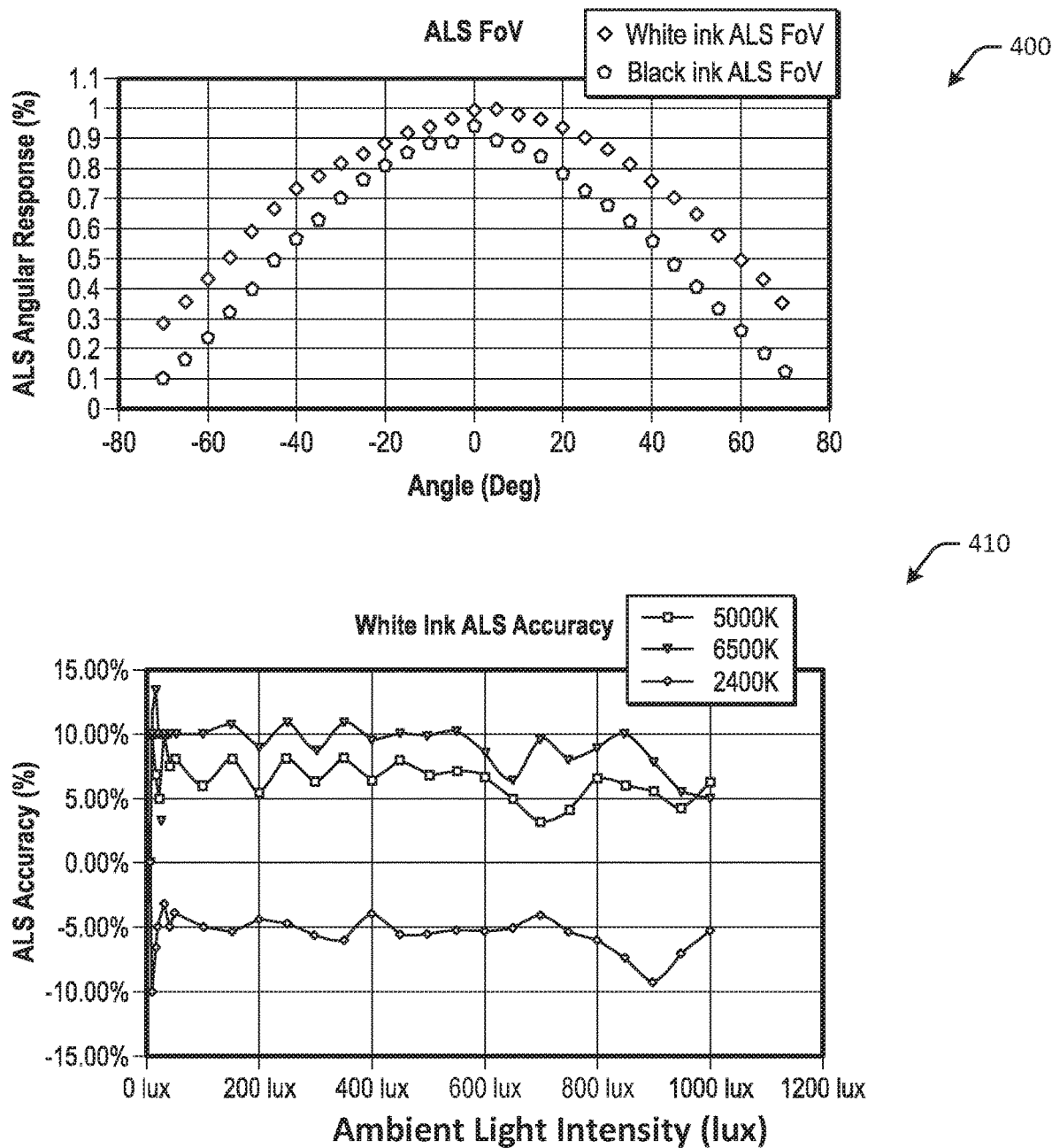
FIG. 4 is a schematic illustration of graphs illustrating sensor performance for devices having invisible sensor apertures in accordance with one or more embodiments of the disclosure.

FIG. 4 is a schematic illustration of graphs illustrating sensor performance for devices having invisible sensor apertures in accordance with one or more embodiments of the disclosure. The graphs illustrated in FIG. 4 correspond to experimental test results.

In a first graph 400, ambient light sensor field of view is plotted, with an ambient light sensor angular response percentage along a vertical axis of the first graph 400, and angle (in degrees) along a horizontal axis of the first graph 400. Two separate sets of data are plotted in the first graph 400, including a first set of data corresponding to a white ink ambient light sensor field of view, and a second set of data corresponding to a black ink ambient light sensor field of view. The white ink ambient light sensor field of view indicates the results corresponding to display stacks in accordance with embodiments of the disclosure, and the black ink ambient light sensor field of view corresponds to display stacks with black ink in sensor apertures. As illustrated by the first graph 400, the white ink ambient light sensor field of view has a greater angular response percentage at all angles relative to the black ink ambient light sensor field of view. This may be due in part to the Lambertian scattering profile of the white inks used in certain embodiments. Accordingly, performance of the white ink ambient light sensor field of view may be better than performance of the black ink ambient light sensor field of view, as far as the respective fields of view, which may result in increased accuracy of light intensity measurements or detections.

In a second graph 410, white ink ambient light sensor accuracy is plotted, with an ambient light sensor accuracy percentage along a vertical axis of the second graph 410, and ambient light intensity (in lux units) along a horizontal axis of the second graph 410. Three separate sets of data are plotted in the second graph 410, including a first set of data corresponding to light having a color temperature of 5000K, a second set of data corresponding to light having a color temperature of 6500K, and a third set of data corresponding to light having a color temperature of 2400K. The white ink ambient light sensor accuracy indicates the results corresponding to display stacks in accordance with embodiments of the disclosure. As illustrated by the second graph 410, the white ink ambient light sensor accuracy is within about +/−20% error for light having color temperatures of 5000K, 6500K, and 2400K. The accuracy of +/−20% is maintained for lux values from 0 lux to at least 1000 lux. Accordingly, accuracy of sensors using embodiments of the disclosure may be improved relative to other techniques, which may result in improved performance.

Figure 5:
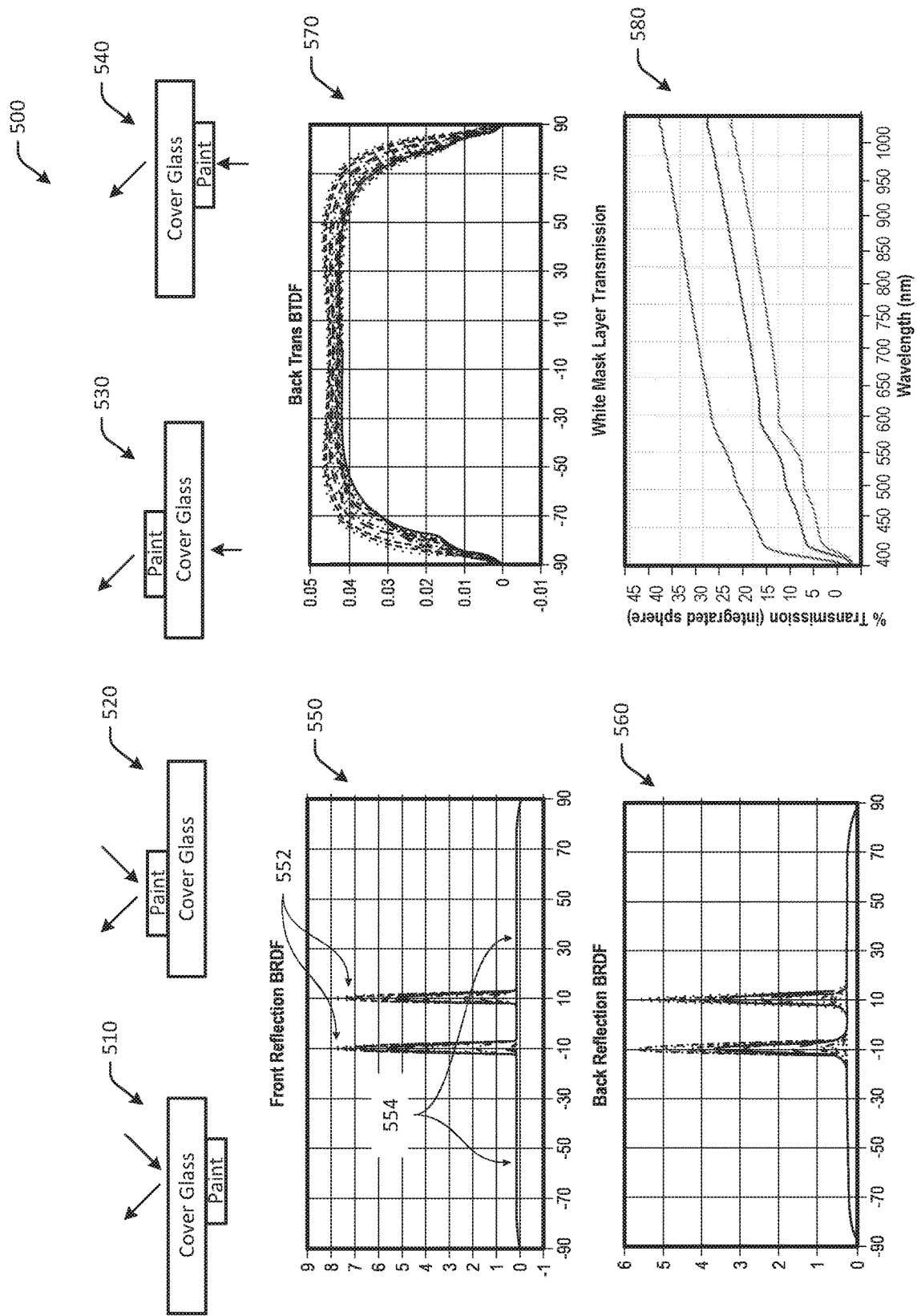
FIG. 5 is a schematic illustration of performance testing configurations and graphs illustrating example optical property test results for devices having invisible sensor apertures in accordance with one or more embodiments of the disclosure.

FIG. 5 is a schematic illustration of performance testing configurations 500 and graphs illustrating example optical property test results for devices having invisible sensor apertures in accordance with one or more embodiments of the disclosure.

A bidirectional scatter distribution function may be used with suitable equipment to determine transmission and reflection measurements. In bidirectional scatter distribution functions, light sources may move in one plane, and an angle of incidence of light that is used for data collection may include 10 degrees, 30 degrees, 50 degrees, and/or 70 degrees.

Bidirectional scatter distribution function equipment may include a detector that moves in an "upper" hemisphere ("upper" is used as a relative and not absolute positioning term), and the angular resolution of measurement may be 0.1 degrees. Data may be collected from −90 degrees to 90 degrees at 1 degree azimuthal steps.

Measurement setup is illustrated in FIG. 5. For front reflection 510, a light source directs light to impinge on a cover glass layer at angles of 10 degrees, 30 degrees, 50 degrees, and 70 degrees, and reflected light is detected by a detector. For backside reflection 520, a light source directs light to impinge on one or more paint layers at angles of 10 degrees, 30 degrees, 50 degrees, and 70 degrees, and reflected light is detected by a detector. For front transmission 530, a light source directs light to propagate through a cover glass layer at angles of 10 degrees, 30 degrees, 50 degrees, and 70 degrees. The light subsequently propagates through the one or more paint layers, and exiting light is detected by a detector. For backside transmission 540, a light source directs light to propagate through one or more paint layers at angles of 10 degrees, 30 degrees, 50 degrees, and 70 degrees. The light subsequently propagate through the cover glass layer, and exiting light is detected by a detector.

A first graph 550 illustrates measured front reflection data, with specular components 552 and diffuse components 554 indicating that the specular component for reflection is fairly clear. A second graph 560 illustrates measured backside reflection data, with similar specular components and diffuse components to the first graph 550, indicating that the specular component for reflection is fairly clear. A third graph 570 illustrates measured backside transmission data, which illustrates a Lambertian scattering profile (e.g., the bidirectional scatter distribution function at 1 degree azimuth steps illustrate the light scattering profile, etc.). A graph illustrating front transmission data may appear relatively similar to the third graph 570. A fourth graph 580 illustrates total transmission measurements as a function of number of white mask ink layers for white mask layer transmission, with a percentage transmission measured using integrated sphere along a vertical axis, and light wavelengths in nanometers along a horizontal axis. The plotted data may correspond to different types of white mask layer inks and/or a function of number of white mask ink layers, in which transmission percentage increases as wavelength increases.

Figure 6:
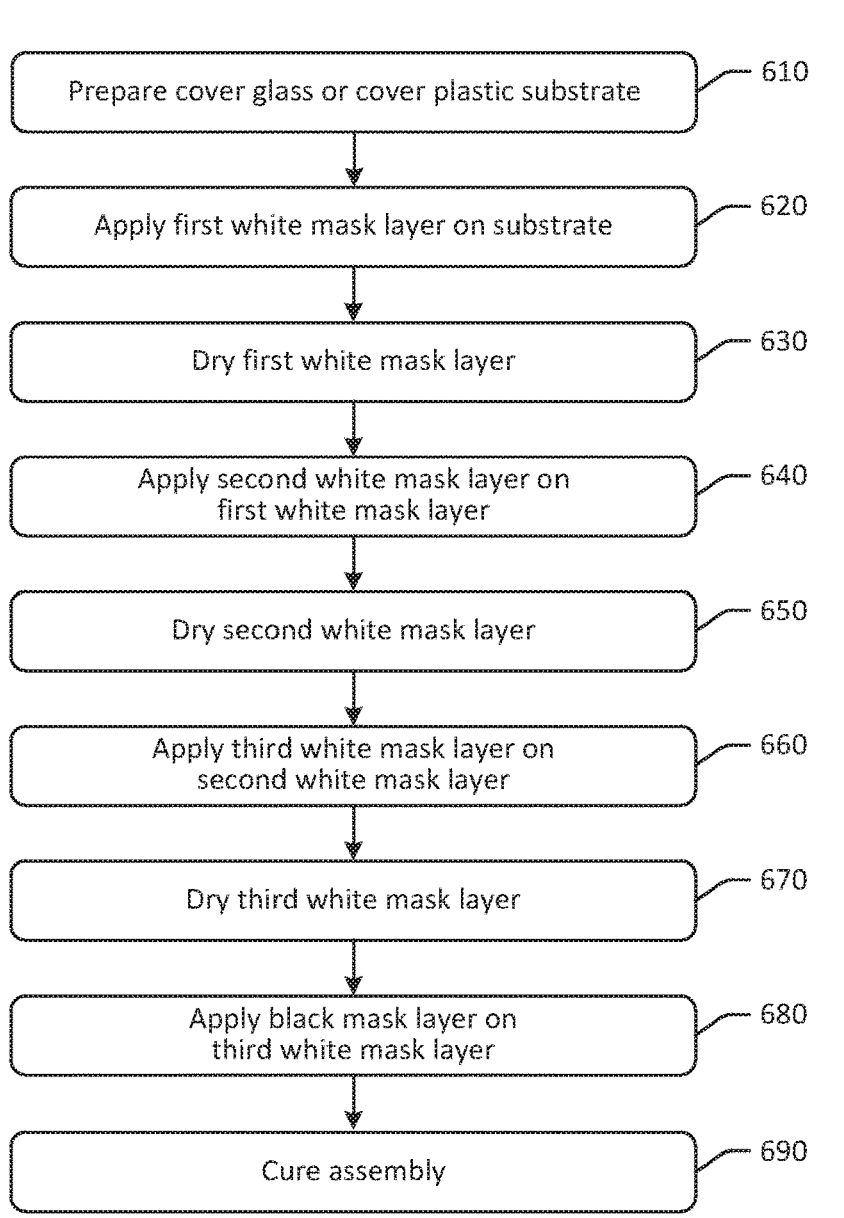
FIG. 6 is an example process flow for manufacturing a display stack in accordance with one or more embodiments of the disclosure.
Figure 6:
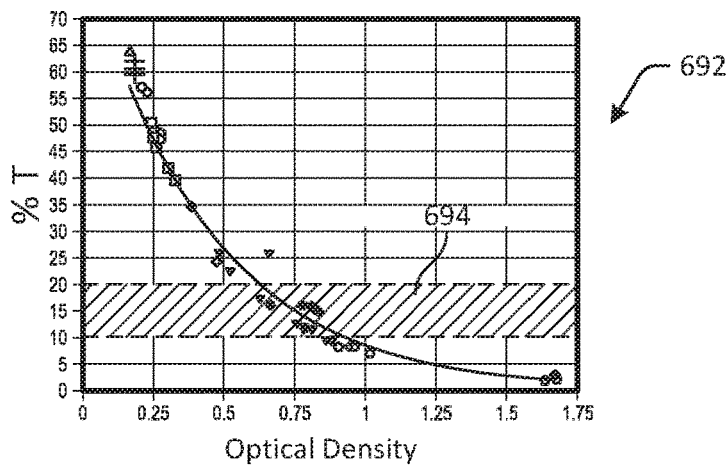

FIG. 6 is an example process flow 600 for manufacturing a display stack in accordance with one or more embodiments of the disclosure. At an optional first operation 610, a cover glass or cover plastic substrate may be prepared. For example, the cover layer may be cut to a desired size and strengthened, and/or may be secured in processing equipment. At a second operation 620, a first white mask layer may be applied on the substrate. For example, white ink may be printed onto the substrate, or a white ink film may be laminated to the substrate. At a third operation 630, the first white mask layer may be dried. For example, the first white mask layer and/or the assembly may be dried at a temperature of between about 75 degrees Celsius to about 95 degrees Celsius. At a fourth operation 640, a second white mask layer may be applied on the first white mask layer. For example, white ink may be printed onto the first white mask layer, or a white ink film may be laminated to the first white mask layer. At a fifth operation 650, the second white mask layer may be dried. For example, the second white mask layer and/or the assembly may be dried at a temperature of between about 75 degrees Celsius to about 95 degrees Celsius. At a sixth operation 660, a third white mask layer may be applied on the second white mask layer. For example, white ink may be printed onto the second white mask layer, or a white ink film may be laminated to the second white mask layer. At a seventh operation 670, the third white mask layer may be dried. For example, the third white mask layer and/or the assembly may be dried at a temperature of between about 75 degrees Celsius to about 95 degrees Celsius. At an eighth operation 680, a black mask layer may be applied on the third white mask layer. For example, black ink may be printed onto the black mask layer, or a black ink film may be laminated to the black mask layer. At a ninth operation 690, the assembly may be cured. For example, the black mask layer and/or the assembly may be dried for about 5 minutes and/or cured at a temperature of between about 125 degrees Celsius to about 175 degrees Celsius for about 30 minutes. For white mask layers, curing and/or drying can be performed at between about 60 degrees Celsius to about 175 degrees Celsius. Inks for plastic may cure at low temperatures relative to inks for glass. Drying may be performed for about 5 minutes to about 10 minutes. Final curing may be performed for about 30 minutes to about 60 minutes.

After the assembly is cured, the display stack may be inspected for optical density values. For example, measurements related to optical density on border ink for opacity may be performed. A graph 692 illustrating light transmission percentages (using integrated sphere methods) along a vertical axis, and optical density along a horizontal axis, is depicted. An acceptable range 694 is illustrated for ambient light sensor performance, which is transmission percentage of between about 10% and about 20% for optical density between 0.6% and about 1%. As illustrated, optical density values from between about 0.625 and 0.9 fall within the acceptable range 694. Values from the graph 692 may be used to monitor quality and consistency during manufacture.

One or more operations of the methods, process flows, or use cases of FIGS. 1-6 may have been described above as being performed by a user device, or more specifically, by one or more program module(s), applications, or the like executing on a device. It should be appreciated, however, that any of the operations of the methods, process flows, or use cases of FIGS. 1-6 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-6 may be described in the context of the illustrative devices, it should be appreciated that such operations may be implemented in connection with numerous other device configurations.

The operations described and depicted in the illustrative methods, process flows, and use cases of FIGS. 1-6 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-6 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 7:
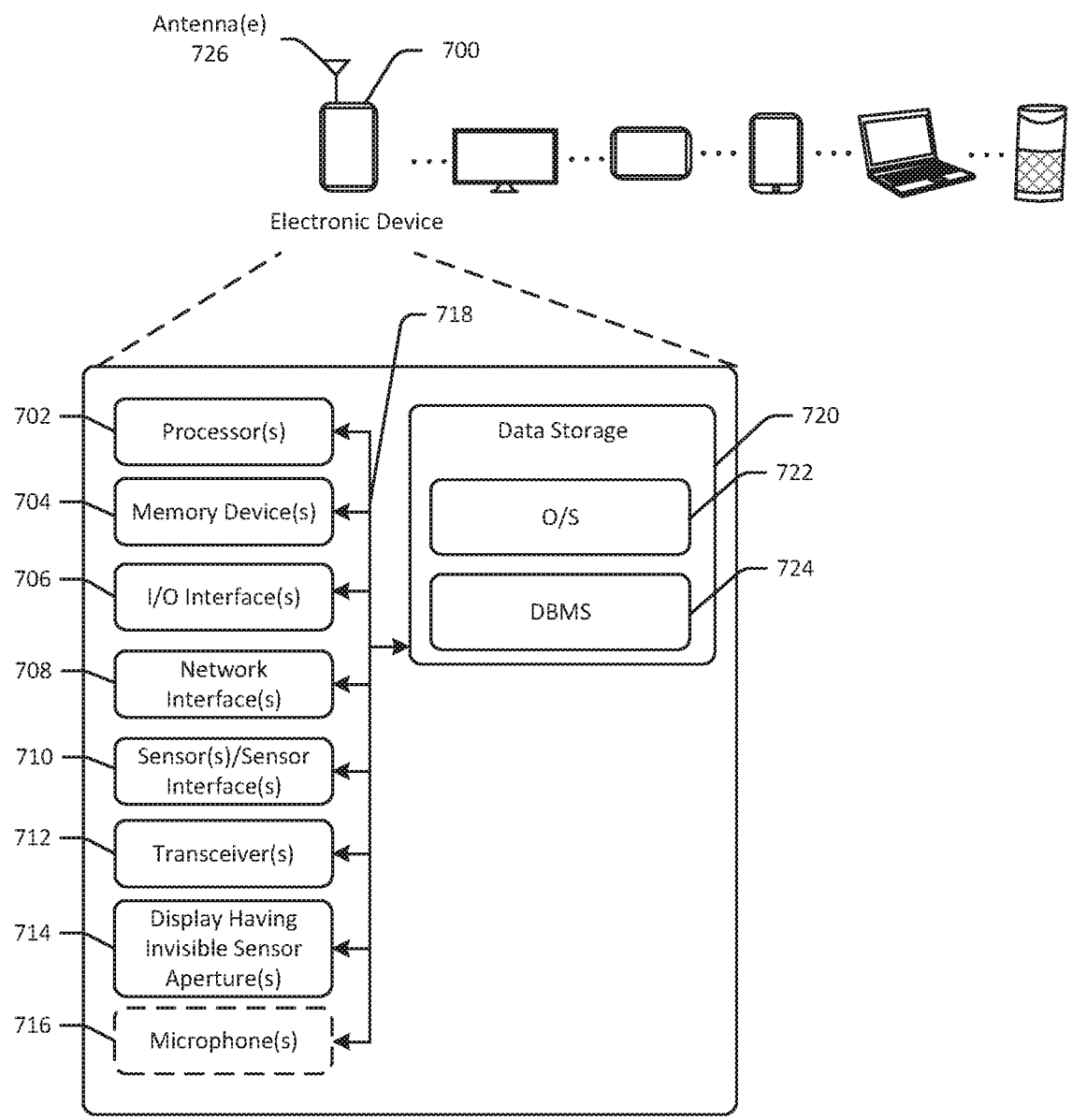
FIG. 7 schematically illustrates an example architecture of an electronic device in accordance with one or more embodiments of the disclosure.

FIG. 7 is a schematic block diagram of one or more illustrative electronic device(s) 700 in accordance with one or more example embodiments of the disclosure. The electronic device(s) 700 may include any suitable computing device including, but not limited to, a server system, a mobile device such as a smartphone, a tablet, an e-reader, a wearable device, or the like; a desktop computer; a laptop computer; a content streaming device; a set-top box; a scanning device; a barcode scanner; or the like. The electronic device(s) 700 may correspond to an illustrative device configuration for the device(s) of FIGS. 1-6.

The electronic device(s) 700 may be configured to communicate with one or more servers, user devices, or the like. The electronic device(s) 700 may be configured to determine voice commands, determine wakeword utterances, present digital content, determine and/or control other devices, and other operations.

The electronic device(s) 700 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 700 may include one or more processors (processor(s)) 702, one or more memory devices 704 (also referred to herein as memory 704), one or more input/output (I/O) interface(s) 706, one or more network interface(s) 708, one or more sensor(s) or sensor interface(s) 710, one or more transceiver(s) 712, one or more display(s) having invisible sensor aperture(s) 714, one or more optional microphone(s)

716, and data storage 720. The electronic device(s) 700 may further include one or more bus(es) 718 that functionally couple various components of the electronic device(s) 700. The electronic device(s) 700 may further include one or more antenna(e) 726 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 718 may include at least one of a system bus, a memory bus, an address bus, or a message bus, and may permit the exchange of information (e.g., data (including computer-executable code), signaling, etc.) between various components of the electronic device(s) 700. The bus(es) 718 may include, without limitation, a memory bus or a memory controller, a peripheral bus, an accelerated graphics port, and so forth. The bus(es) 718 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 704 of the electronic device(s) 700 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 704 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 704 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 720 may include removable storage and/or non-removable storage including, but not limited to, magnetic storage, optical disk storage, and/or tape storage. The data storage 720 may provide non-volatile storage of computer-executable instructions and other data. The memory 704 and the data storage 720, removable and/or non-removable, are examples of computer-readable storage media (CRSM) as that term is used herein.

The data storage 720 may store computer-executable code, instructions, or the like that may be loadable into the memory 704 and executable by the processor(s) 702 to cause the processor(s) 702 to perform or initiate various operations. The data storage 720 may additionally store data that may be copied to the memory 704 for use by the processor(s) 702 during the execution of the computer-executable instructions. Moreover, output data generated as a result of execution of the computer-executable instructions by the processor(s) 702 may be stored initially in the memory 704, and may ultimately be copied to the data storage 720 for non-volatile storage.

More specifically, the data storage 720 may store one or more operating systems (O/S) 722; one or more database management systems (DBMS) 724; and one or more program module(s), applications, engines, computer-executable code, scripts, or the like. Some or all of these module(s) may be sub-module(s). Any of the components depicted as being stored in the data storage 720 may include any combination of software, firmware, and/or hardware. The software and/or firmware may include computer-executable code, instructions, or the like that may be loaded into the memory 704 for execution by one or more of the processor(s) 702. Any of the components depicted as being stored in the data storage 720 may support functionality described in reference to corresponding components named earlier in this disclosure.

The data storage 720 may further store various types of data utilized by the components of the electronic device(s) 700. Any data stored in the data storage 720 may be loaded into the memory 704 for use by the processor(s) 702 in executing computer-executable code. In addition, any data depicted as being stored in the data storage 720 may potentially be stored in one or more datastore(s) and may be accessed via the DBMS 724 and loaded in the memory 704 for use by the processor(s) 702 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 702 may be configured to access the memory 704 and execute the computer-executable instructions loaded therein. For example, the processor(s) 702 may be configured to execute the computer-executable instructions of the various program module(s), applications, engines, or the like of the electronic device(s) 700 to cause or facilitate various operations to be performed in accordance with one or more embodiments of the disclosure. The processor(s) 702 may include any suitable processing unit capable of accepting data as input, processing the input data in accordance with stored computer-executable instructions, and generating output data. The processor(s) 702 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 702 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 702 may be capable of supporting any of a variety of instruction sets.

Referring now to other illustrative components depicted as being stored in the data storage 720, the O/S 722 may be loaded from the data storage 720 into the memory 704 and may provide an interface between other application software executing on the electronic device(s) 700 and the hardware resources of the electronic device(s) 700. More specifically, the O/S 722 may include a set of computer-executable instructions for managing the hardware resources of the electronic device(s) 700 and for providing common services to other application programs (e.g., managing memory allocation among various application programs). In certain example embodiments, the O/S 722 may control execution of the other program module(s). The O/S 722 may include any operating system now known or which may be developed in the future including, but not limited to, any server operating system, any mainframe operating system, or any other proprietary or non-proprietary operating system.

The DBMS 724 may be loaded into the memory 704 and may support functionality for accessing, retrieving, storing, and/or manipulating data stored in the memory 704 and/or data stored in the data storage 720. The DBMS 724 may use any of a variety of database models (e.g., relational model, object model, etc.) and may support any of a variety of query languages. The DBMS 724 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 700 is a mobile device, the DBMS 724 may be any suitable lightweight DBMS optimized for performance on a mobile device.

Referring now to other illustrative components of the electronic device(s) 700, the input/output (I/O) interface(s) 706 may facilitate the receipt of input information by the electronic device(s) 700 from one or more I/O devices as well as the output of information from the electronic device(s) 700 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 700 or may be separate. The I/O devices may further include, for example, any number of peripheral devices such as data storage devices, printing devices, and so forth.

The I/O interface(s) 706 may also include an interface for an external peripheral device connection such as universal serial bus (USB), FireWire, Thunderbolt, Ethernet port or other connection protocol that may connect to one or more networks. The I/O interface(s) 706 may also include a connection to one or more of the antenna(e) 726 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 700 may further include one or more network interface(s) 708 via which the electronic device(s) 700 may communicate with any of a variety of other systems, platforms, networks, devices, and so forth. The network interface(s) 708 may enable communication, for example, with one or more wireless routers, one or more host servers, one or more web servers, and the like via one or more networks.

The antenna(e) 726 may include any suitable type of antenna depending, for example, on the communications protocols used to transmit or receive signals via the antenna(e) 726. Non-limiting examples of suitable antennae may include directional antennae, non-directional antennae, dipole antennae, folded dipole antennae, patch antennae, multiple-input multiple-output (MIMO) antennae, or the like. The antenna(e) 726 may be communicatively coupled to one or more transceivers 712 or radio components to which or from which signals may be transmitted or received.

As previously described, the antenna(e) 726 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 726 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 726 may be configured to transmit or receive radio frequency signals within any suitable frequency range forming part of the unlicensed portion of the radio spectrum.

The antenna(e) 726 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 712 may include any suitable radio component(s) for—in cooperation with the antenna(e) 726—transmitting or receiving radio frequency (RF) signals in the bandwidth and/or channels corresponding to the communications protocols utilized by the electronic device(s) 700 to communicate with other devices. The transceiver(s) 712 may include hardware, software, and/or firmware for modulating, transmitting, or receiving—potentially in cooperation with any of antenna(e) 726—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 712 may further include hardware, firmware, or software for receiving GNSS signals. The transceiver(s) 712 may include any known receiver and baseband suitable for communicating via the communications protocols utilized by the electronic device(s) 700. The transceiver(s) 712 may further include a low noise amplifier (LNA), additional signal amplifiers, an analog-to-digital (A/D) converter, one or more buffers, a digital baseband, or the like.

The sensor(s)/sensor interface(s) 710 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The display(s) having invisible sensor aperture(s) 714 may be a display stack with a cover lens as described herein, such as those described in conjunction with FIGS. 1-6. The microphone(s) 716 may be any device configured to receive analog sound input or voice data.

It should be appreciated that the program module(s), applications, computer-executable instructions, code, or the like depicted in FIG. 7 as being stored in the data storage 720 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 700, and/or hosted on other computing device(s) accessible via one or more networks, may be provided to support functionality provided by the program module(s), applications, or computer-executable code depicted in FIG. 7 and/or additional or alternate functionality. Further, functionality may be modularized differently such that processing described as being supported collectively by the collection of program module(s) depicted in FIG. 7 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 7 may be implemented, at least partially, in hardware and/or firmware across any number of devices.

It should further be appreciated that the electronic device(s) 700 may include alternate and/or additional hardware, software, or firmware components beyond those described or depicted without departing from the scope of the disclosure. More particularly, it should be appreciated that software, firmware, or hardware components depicted as forming part of the electronic device(s) 700 are merely illustrative and that some components may not be present or additional components may be provided in various embodiments. While various illustrative program module(s) have been depicted and described as software module(s) stored in the data storage 720, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-6 may be performed by a device having the illustrative configuration depicted in FIG. 7, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-6 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-6 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. An electronic device comprising:
a housing;
an ambient light sensor configured to detect ambient light, the ambient light sensor disposed within the housing; and
a display coupled to the housing, the display comprising:
a cover glass layer comprising a first surface and a second surface, wherein the first surface forms an outer surface of the electronic device;
a first layer disposed on the second surface, the first layer formed of a white ink that is translucent;
a second layer disposed on the first layer, the second layer comprising the white ink;
a third layer disposed on the second layer, the third layer comprising the white ink; and
a fourth layer formed of a black ink, wherein the fourth layer comprises a first aperture that is aligned with the ambient light sensor;
wherein the white ink is transmissive to ambient light, and the ambient light sensor is configured to detect ambient light that propagates through the cover glass layer, the first layer, the second layer, and the third layer, and
wherein the first layer, the second layer, and the third layer together form a reflective structure, and wherein an intensity of light reflected from the reflective structure is proportional to a cosine of an angle between a direction of incident light and the reflective structure.

2. The electronic device of claim 1, wherein the white ink comprises a weight ratio of between about 40% and about 60% titanium oxide, the titanium oxide having a particle size of about 0.15 microns;
wherein the fourth layer is disposed on the third layer.

3. The electronic device of claim 1, further comprising:
a fifth layer disposed on the third layer, the fifth layer comprising the white ink; and
a sixth layer disposed on the fifth layer, the sixth layer comprising the white ink;
wherein the first aperture extends through the fifth layer and the sixth layer.

4. The electronic device of claim 1, wherein the white ink is configured to transmit between about 5% and about 25% of light having a visible wavelength, and less than about 30% of light having an infrared wavelength.

5. A display comprising:
a cover layer;
a first layer disposed on the cover layer, the first layer comprising a substantially white ink that is translucent;
a second layer disposed on the first layer, the second layer comprising the substantially white ink;
a third layer disposed on the second layer, the third layer comprising the substantially white ink; and
a fourth layer comprising a dark-colored ink, wherein the fourth layer comprises a first aperture aligned with a sensor of the device located beneath the fourth layer;
wherein the first layer, the second layer, and the third layer together form a reflective structure, and wherein an intensity of light reflected from the reflective structure is proportional to a cosine of an angle between a direction of incident light and the reflective structure.

6. The display of claim 5, wherein the white ink comprises a weight ratio of between about 40% and about 60% titanium oxide, the titanium oxide having a particle size of between about 0.15 microns and about 0.25 microns.

7. The display of claim 5, wherein the first layer, the second layer, and the third layer are configured to scatter ambient light that propagates through the first layer, the second layer, and the third layer.

8. The display of claim 5, further comprising:
a fifth layer disposed on the third layer, the fifth layer comprising the substantially white ink; and
a sixth layer disposed on the fifth layer, the sixth layer comprising the substantially white ink;
wherein the fourth layer is disposed on the sixth layer, and wherein the first aperture extends through the fifth layer and the sixth layer.

9. The display of claim 5, wherein the substantially white ink is configured to transmit between about 5% and about 25% of light having a visible wavelength, and less than about 30% of light having an infrared wavelength.

10. The display of claim 5, wherein the first layer, the second layer, and the third layer are continuous layers overlaying the first aperture.

11. The display of claim 5, further comprising an ink layer about a perimeter of the display, wherein the ink layer comprises the substantially white ink.

12. The display of claim 5, wherein the first layer, the second layer, and the third layer have a first thickness, and wherein the fourth layer has a second thickness that is less than the first thickness.

13. A device comprising:
an ambient light sensor; and
a display comprising:
a cover layer;
a first plurality of layers disposed on the cover layer, the first plurality of layers comprising a substantially white ink that is translucent, wherein the first plurality of layers together form a reflective structure, and wherein an intensity of light reflected from the reflective structure is proportional to a cosine of an angle between a direction of incident light and the reflective structure; and
a second layer comprising a dark-colored ink, wherein the second layer comprises a first aperture aligned with the ambient light sensor;
wherein the first plurality of layers overlay the first aperture.

14. The device of claim 13, wherein the white ink comprises a weight ratio of between about 40% and about 60% titanium oxide, the titanium oxide having a particle size of between about 0.15 microns and about 0.25 microns.

15. The device of claim 13, wherein the first plurality of layers comprises at least three layers.

16. The device of claim 13, wherein the substantially white ink is configured to transmit between about 5% and about 25% of light having a visible wavelength, and less than about 30% of light having an infrared wavelength.

17. The device of claim 13, wherein the first plurality of layers span over the first aperture.

18. The device of claim 13, wherein the substantially white ink extends about a border of the display.

* * * * *